United States Patent

Heerman et al.

[11] Patent Number: 5,929,516
[45] Date of Patent: *Jul. 27, 1999

[54] POLYMER STUD GRID ARRAY

[75] Inventors: Marcel Heerman, Merelbeke; Joost Wille, Loppem; Jozef Van Puymbroeck, Oostkamp; Jean Roggen, Lummen; Eric Beyne, Leuven; Rita Van Hoof, Boortmeerbeek, all of Belgium

[73] Assignees: Siemens N.V.; Interuniversitair Micro-Electronica Centrum VZW, both of Brussels, Belgium

[*] Notice: This patent issued on a continued prosecution application filed under 37 CFR 1.53(d), and is subject to the twenty year patent term provisions of 35 U.S.C. 154(a)(2).

[21] Appl. No.: 08/809,030
[22] PCT Filed: Sep. 22, 1995
[86] PCT No.: PCT/EP95/03763
  § 371 Date: Mar. 21, 1997
  § 102(e) Date: Mar. 21, 1997
[87] PCT Pub. No.: WO96/09646
  PCT Pub. Date: Mar. 28, 1996

[30] Foreign Application Priority Data

Sep. 23, 1994 [DE] Germany .................. 44 34 086

[51] Int. Cl.$^6$ .................................................. H01L 23/053
[52] U.S. Cl. .................. 257/701; 257/737; 257/778; 257/779
[58] Field of Search .................................. 257/778, 779, 257/734, 737, 701, 702

[56] References Cited

U.S. PATENT DOCUMENTS

| 3,271,507 | 9/1966 | Elliott . |
| 3,483,308 | 12/1969 | Wakely . |
| 5,081,520 | 1/1992 | Yoshii et al. . |
| 5,477,087 | 12/1995 | Kawakita et al. ............ 257/778 |
| 5,650,662 | 7/1997 | Edwards et al. ............ 257/701 |

FOREIGN PATENT DOCUMENTS

| 0 100 727 | 2/1984 | European Pat. Off. . |
| 0 361 192 A2 | 9/1989 | European Pat. Off. . |
| 0 558 325 A1 | 2/1993 | European Pat. Off. . |

(List continued on next page.)

OTHER PUBLICATIONS

"BGA–Die Alternative" from *Die Fachzeitschrift für Elektronic–Fertigung und Test*, Productronic 5, 1994, pp. 54 and 55. (In German).
"Pad Grid Array Package" *Patent Abstracts of Japan*: E–872, Jan. 12, 1990, vol. 14, No. 16.
"Bump on Electronic Circuit Board, Formation Method of Bump on Electronic Circuit Board and of Circuit Pattern," *Patent Abstracts of Japan*: E–1261, Sep. 8, 1992, vol. 16, No. 429.

(List continued on next page.)

*Primary Examiner*—Peter Toby Brown
*Assistant Examiner*—Roy Potter
*Attorney, Agent, or Firm*—Hill & Simpson

[57] ABSTRACT

A structural shape has an injection molded, three-dimensional substrate composed of an electrically insulating polymer, polymer studs planarly arranged on the underside of the substrate and co-formed during injection molding, outside terminals formed on the polymer studs by a solderable end surface, interconnections fashioned at least on the underside of the substrate that connect the outside terminals to inside terminals, and at least one chip arranged on the substrate and whose terminals are electrically conductively connected to the inside terminals. The structural shape is suitable for single, few or multi chip module and unites the advantages of a ball grid array with the advantages of MID technology (Molded Interconnection Devices). The manufacture and metallization of the polymer studs can take place with minimal additional outlay in the framework of the method steps already required in the MID technology.

10 Claims, 3 Drawing Sheets

FOREIGN PATENT DOCUMENTS

| | | |
|---|---|---|
| 37 08 309 A1 | 3/1987 | Germany . |
| 37 32 249 A1 | 9/1987 | Germany . |
| WO 89/00346 | 6/1988 | WIPO . |
| WO 89/00346 | 1/1989 | WIPO . |
| WO89/1005 | 10/1989 | WIPO . |

OTHER PUBLICATIONS

"Structure of Bump Electrode and Its Manufacture," *Patent Abstracts of Japan*: E–1429, Sep. 9, 1993, vol. 17, No. 501.

"High Density Bump Forming Method," *Patent Abstracts of Japan*: E–1437, Sep. 22, 1993, vol. 17, No. 528.

POLYMER STUD GRID ARRAY

This application was filed under 35 U.S.C. 371 and claims priority from PCT/EP95/03763, filed Sep. 22, 1995.

BACKGROUND OF THE INVENTION

Integrated circuits are being given higher and higher numbers of terminals and are thereby continuing to be miniaturized further. The difficulties with the application of solder paste and with equipping to be anticipated given this increasing miniaturization are to be overcome by new housing forms, whereby single, few or multi chip modules in a ball grid array package are to be particularly emphasized here (German periodical, productornic 5, 1994, pages 54, 55). These modules are based on a through-contacted substrate on which the chips are contacted, for example, via contacting wires or with flip-chip mounting. The ball grid array (BGA), which is often also referred to as solder grid array, land grid array or solder bump array, is situated at the underside of the substrate. At the underside of the substrate, the ball grid array comprises planarly arranged solder bumps that enable a surface mounting on the printed circuit boards or assemblies. High numbers of terminals in a rough grid of, for example, 1.27 mm can be realized as a result of the planar arrangement of the solder bumps.

Injection molded parts with integrated interconnections are employed instead of conventional printed circuits in what is referred to as MID technology (MID=Moulded Interconnection Devices). High-grade thermoplastics that are suitable for the injection molding of three-dimensional substrates are the basis of this technology. Such thermoplastics are distinguished over traditional substrate materials for printed circuits by better mechanical, thermal, chemical, electrical and environmental properties. In a specific direction of MID technology, what is referred to as SIL technology (SIL=Spritzgiessteile mit integrierten Leiterzugen [injection molded parts with integrated interconnections]), the structuring of a metal layer applied onto the injection molded parts ensues with a specific laser structuring method, foregoing the otherwise standard mask technique. A number of mechanical and electrical functions can thereby be integrated into the three-dimensional injection molded parts with structured metallization. The housing carrier function simultaneously assumes guides and snap-in connections, whereas the metallization layer, in addition to the wiring and connecting function, also serves as electromagnetic shielding and sees to a good heat elimination. Further details about the manufacture of three-dimensional injection molded parts with integrated connector trains derive, for example, from German Patent DE-A- 37 32 249 or European Patent EP-A-0 361 192.

U.S. Pat. No. 5,081,520 discloses a method for fastening IC chips on substrates wherein the substrates are produced as injection molded parts with integrated bumps for the fastening of the IC chips. A connecting layer is applied after the metallization, so that the IC chips can be secured to the substrates, whereby the chip terminal surfaces are electrically conductively connected to the allocated metallizations of the bumps.

SUMMARY OF THE INVENTION

The invention is based on the problem of creating a new structural shape for single, few or multi chip modules that exhibits the advantages of MID technology and enables a planar arrangement of the outside terminals as in a ball grid array. To this end, a polymer stud grid array is provided. The polymer stud grid array has an injection molded, three-dimensional substrate composed of an electrically insulating polymer. Polymer studs are co-formed on the underside of the substrate during injection molding. Outside terminals are formed on the polymer studs by a solderable end surface. Interconnections are fashioned at least on the underside of the substrate that connect the outside terminals to inside terminals. At least one chip is arranged on the substrate whose terminals are electrically conductively connected to the inside terminals wherein the polymer studs form the polymer studs planarly arranged in the grid array on the underside of the substrate.

Based on the ball grid array (BGA), the inventive structural shape is referred to as polymer stud grid array (PSGA), whereby the term "polymer stud" is intended to indicate the polymer bumps that are co-shaped in the injection molding of the substrate. In addition to the simple and cost-beneficial manufacture of the polymer studs in the injection molding of the substrate, the manufacture of the outside terminals on the polymer studs can also be undertaken with minimum outlay together with the manufacture of the interconnections standard in MID technology or, respectively, SIL technology. On the basis of the fine laser structuring preferred in SIL technology, the outside terminals on the polymer studs can be realized in a very fine grid with high numbers of terminals. It must also be emphasized that the temperature expansion of the polymer studs corresponds to the temperature expansion of the substrate and of the printed circuit board accepting the module. If mechanical stresses occur, then the polymer studs enable at least a partial compensation due to their elastic properties. As a result of the shape stability of the outside terminals fomed on the polymer studs, the dependability given repair and replacement can also be substantially enhanced compared to ball grid arrays with their outside terminals formed by solder bumps.

In an embodiment, the polymer stud grid array enables a sunken mounting of the chips in troughs of the injection molded substrates, as a result whereof an extremely low thickness of the resultant single, few or multi chip modules can be realized. The sunken mounting also enables an optimum protection of the chips as well as a simple and hermetically tight encapsulation.

In an embodiment, the polymer stud grid array enables a contacting of the chips in the proven wire bond technique. In another embodiment, the attachment of the contacting wires can be facilitated by the arrangement of the inside terminals on a step of the trough.

In an embodiment, the flip-chip technique can also be successfully employed for the contacting of the chips.

In an embodiment, flip-chip contacting is provided for direct connection of the chip terminals to the allocated inside terminals wherein the chip terminals can be fashioned as meltable bumps.

In an embodiment, however, the inside terminals in the flip-chip contacting can also be formed by polymer studs co-formed in the injection molding of the substrate and provided with a solderable end surface. As a result thereof, first, normal chips without meltable bumps can be employed, whereas, second, the manufacture and metallization of the polymer studs in the MID technology can be implemented practically without additional outlay. Additionally, the polymer studs have the advantage that they allow an elastic compensation between different expansion behavior of substrate and chip.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
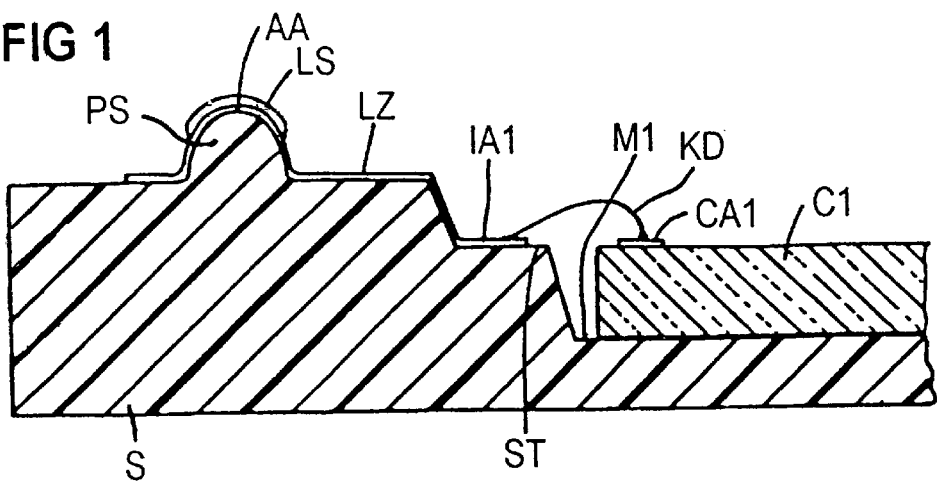
FIG. 1 illustrates a sectional view through a polymer stud grid array with a chip contacted in a wire bond technique.

FIG. 1 shows a sectional view through a part of a polymer stud grid array with a chip C1 contacted using a wire bond technique. The basis of the illustrated array is a substrate S that is provided with "polymer studs" or, respectively, polymer bumps PS and a trough M1, whereby the trough M1 comprises a step referenced ST. The manufacture of the substrate S, including polymer studs PS, trough M1 and step ST, ensues by injection molding wherein thermoplastics resistant to high temperature, such as polyethurimide, polyether sulfone or liquid crystal polymers, are suitable as substrate materials.

The substrate S shown in FIG. 1 is metallized surface-wide in conformity with MID technology and is then subjected to a laser structuring process, whereby outside terminals M on the polymer studs PS, inside terminals IA1 on the step ST and interconnections LZ extending therebetween remain as result of this laser structuring. The outside terminals AA are provided with a solder layer LS in their cap region, whereby this solder layer LS is formed, for example, by a tin-lead alloy. Instead of the solder layer LS, a solderable end surface composed, for example, of a layer sequence of nickel and gold can also be provided. The inside terminals IA1 arranged on the step ST are connected via contacting wires KD to the terminals CA1 of the chip C1 secured to the floor of the trough M1 in face-up positions.

The polymer stud grid array shown in FIG. 1 is downwardly contacted with the outside terminals AA formed on the polymer studs PS to a printed circuit board or assembly that is not shown. Contrary to the position shown in FIG. 1, the side having the polymer studs PS is thus the underside of the substrate S.

Figure 2:
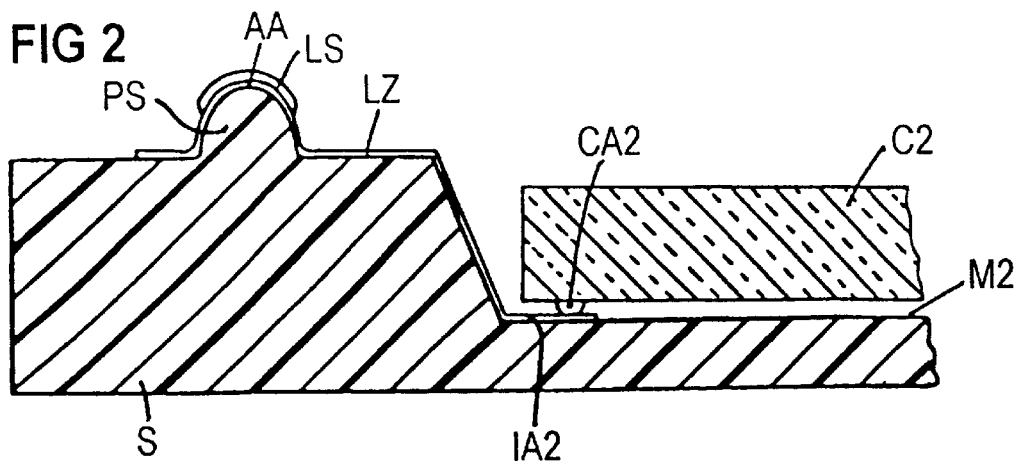
FIG. 2 illustrates a sectional view through a polymer stud grid array with a chip contacted in a flip-chip technique according to a first embodiment of the present invention.

FIG. 2 shows a sectional view through a part of a polymer stud grid array having a chip C2 contacted using in flip-chip technique according to a first embodiment. Differing from FIG. 1, the inside terminals referenced IA2 lie at the floor of a trough referenced M2. The chip C2 arranged in face-down position in the trough M2 has chip terminals CA2 in the form of meltable bumps that lie on the allocated inside terminals IA2 and are joined thereto when soldered.

Figure 3:
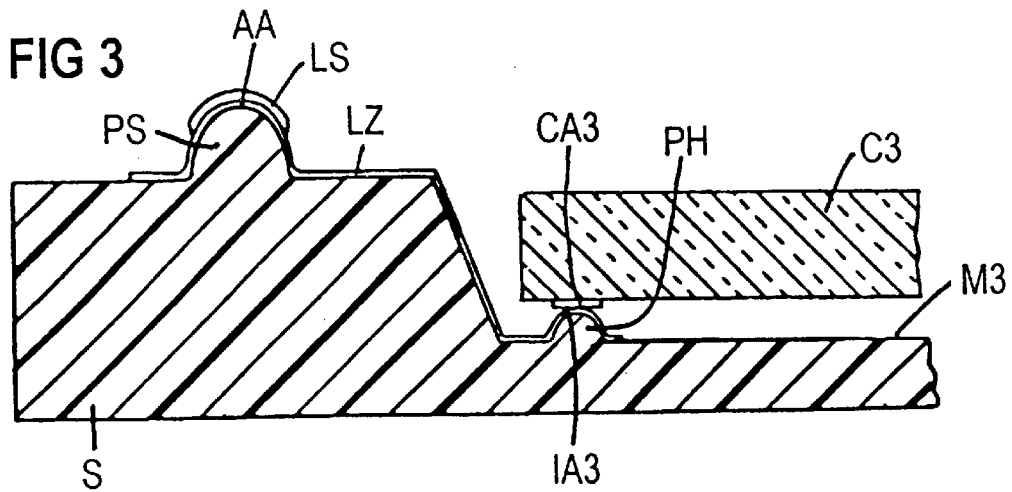
FIG. 3 illustrates a sectional view through a polymer stud grid array with a chip contacted in a flip-chip technique according to a second embodiment of the present invention.

FIG. 3 shows a sectional view through a part of a polymer stud grid array with a chip C3 contacted using a flip-chip technique according to a second embodiment. Differing from FIGS. 1 and 2, the inside terminals referenced IA3 here are formed by polymer studs PH that are additionally co-formed in the bottom region of the trough M3 during the injection molding of the substrate S and that are provided with a solderable end surface. The polymer studs PH for the inside terminals IA3 exhibit about one-third of the volume of the polymer studs PS for the outside terminals AA. The chip C3, which is arranged in face-down position in the trough M3, has its chip terminals CA3 lying on the allocated inside terminals IA3 of the polymer studs PH and is connected to the latter by soldering. The solder (not shown here) can, for example, be offered in the form of a solder layer applied onto the inside terminals IA3 in the cap region, in the same way as in the case of the outside terminals AA.

Figure 4:
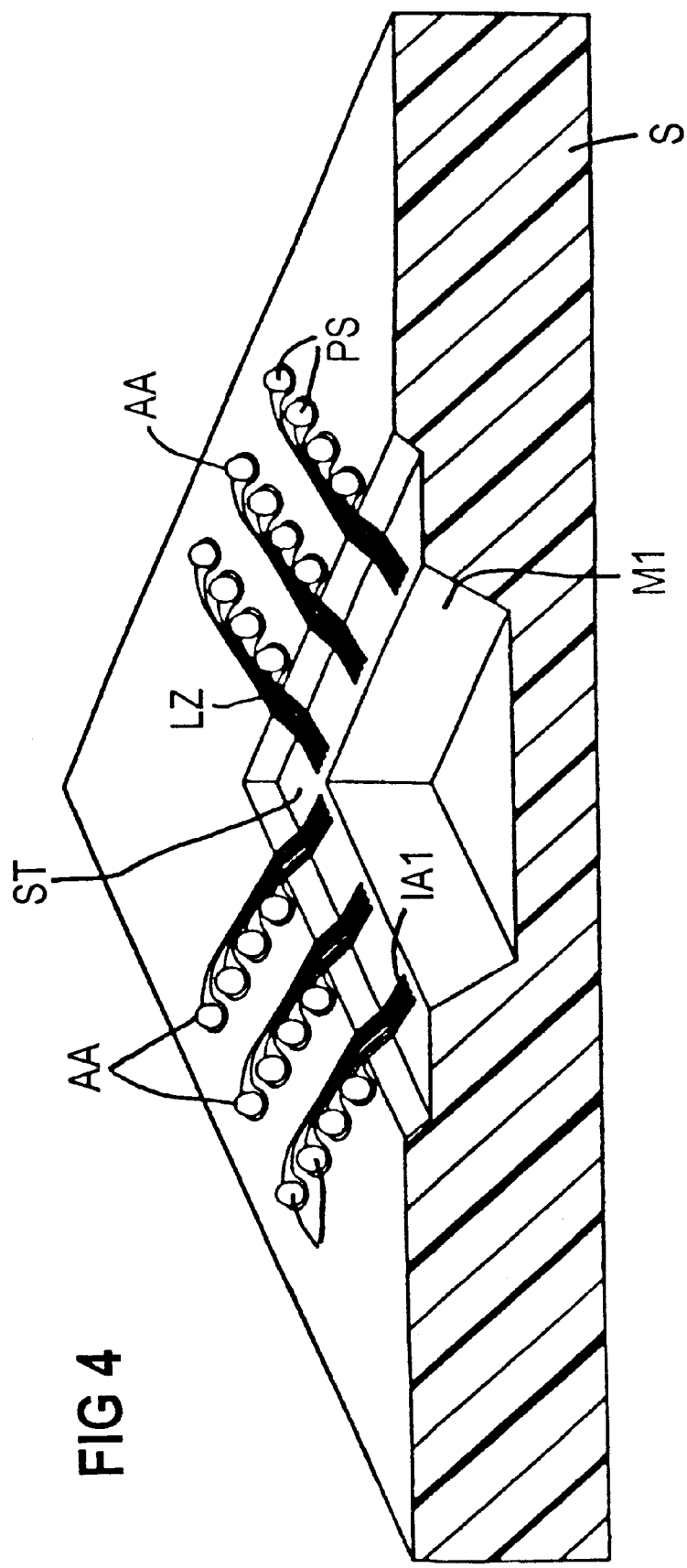
FIG. 4 illustrates a sectional view through the substrate of the polymer stud grid array with a plan view onto outside terminals, interconnections and inside terminals.
Figure 5:
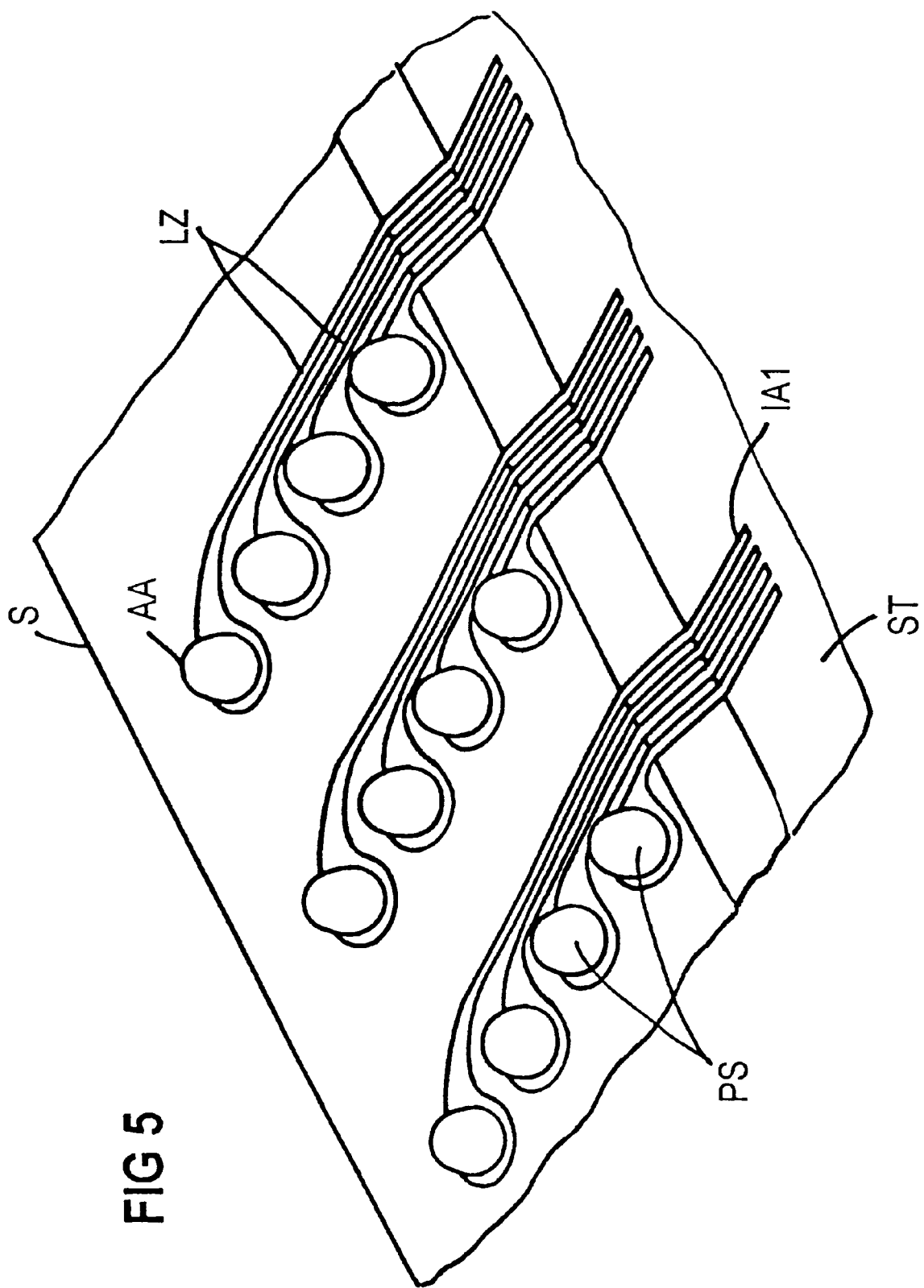
FIG. 5 illustrates an enlarged view FIG. 4 with outside terminals, interconnections and inside terminals.

FIGS. 4 and 5 show details of the polymer stud grid array shown in FIG. 1, whereby the substrate S is shown here, however, before the fastening of the chip C1 in the trough M1. It can be seen that the outside terminals AA formed on the polymer studs PS can be arranged in rows in a fine grid. The fine laser structuring that is standard in the MID technology also allows a closely adjacent arrangement of the interconnections LZ and of the inside terminals IA1 lying on the step ST.

The exemplary embodiments explained above with reference to FIGS. 1 through 5 show the principle of a polymer stud grid array with outside terminals formed on polymer studs. Deviating from the shape shown in the drawing, the polymer studs can also exhibit different shapes such as, for example, the shape of a frustum. Even though only respectively one chip is shown, the new structural shape can be applied given single, few or multi chip modules. For example, the chips can also be encapsulated by casting out the troughs or by attaching covers. A metallization layer on the upper side and the lateral surfaces of the injection molded substrate can also remain as electromagnetic shielding or for good heat elimination. However, it is also possible to provide the substrate with through-contactings and to arrange a second wiring level on the upper side. Further conductor levels in the fashion of a multilayer wiring can also be formed on this second wiring level after the application of appropriate dielectric layers. Given a substrate provided with through-contactings, the polymer studs and the chip or the chips can also be arranged at different sides of the substrate. Such an arrangement of polymer studs and chips on opposite sides of the substrate is particularly interesting given large chips that require a multitude of allocated outside terminals.

Furthermore, it should also be understood that other various changes and modifications to the presently preferred embodiments described herein will be apparent to those skilled in the art. Such changes and modifications may be made without departing from the spirit and scope of the present invention and without diminishing its attendant advantages. Therefore, it is intended that such changes and modifications be covered by the appended claims.

We claim:

1. A polymer stud grid array comprising:

an injection molded, three-dimensional substrate composed of an electrically insulating polymer;

the substrate comprising an underside with a plurality of polymer studs integrally formed on the underside of the substrate during the injection molding thereof;

the polymer studs each comprising a solderable end surface, each solderable end surface being coated with an outside terminal;

each outside terminal being connected to at least one of a plurality of interconnections, each interconnection being disposed on the underside of the substrate, each interconnection connecting one of the outside terminals to one of a plurality of inside terminals;

at least one chip arranged on the underside of the substrate, the chip comprising terminals that are electrically conductively connected to the inside terminals and wherein the polymer studs planarly arranged in the grid array on the underside of the substrate.

2. The polymer stud grid array according to claim 1 wherein the substrate comprises a trough with the chip being arranged in the trough of the substrate.

3. The polymer stud grid array according to claim 2 wherein the chip is arranged in a face-up position in the trough and further wherein the terminals of the chip are electrically conductively connected to the allocated inside terminals via contacting wires.

4. The polymer stud grid array according to claim 3 wherein the trough comprises a step and the inside terminals are arranged on a step of the trough.

5. The polymer stud grid array according to claim 2 wherein the chip is arranged in a face-down position in the trough and further wherein the terminals of the chip are electrically conductively connected by flip-chip contacting to the inside terminals arranged at the floor of the trough.

6. The polymer stud grid array according to claim 5 wherein the terminals of the chip are fashioned as meltable bumps.

7. The polymer stud grid array according to claim 5 wherein the inside terminals are formed by additional polymer studs that are co-formed when injection molding the substrate and that are provided with a solderable end surface.

8. A polymer stud grid array comprising:

an injection molded, three-dimensional substrate composed of an electrically insulating polymer;

the substrate comprising an underside with a plurality of polymer studs integrally formed on the underside of the substrate during the injection molding thereof;

the polymer studs each comprising a solderable end surface, each solderable end surface being coated with an outside terminal;

each outside terminal being connected to at least one of a plurality of interconnections, each interconnection being disposed on the underside of the substrate, each interconnection connecting one of the outside terminals to one of a plurality of inside terminals;

at least one chip arranged on the substrate, the chip comprising terminals that are electrically conductively connected to the inside terminals wherein the polymer studs planarly arranged in the grid array on the underside of the substrate, the substrate further comprising a trough with the chip being arranged in the trough of the substrate, the chip being arranged in a face-down position in the trough and further wherein the terminals of the chip are electrically conductively connected by flip-chip contacting to the inside terminals arranged at the floor of the trough.

9. The polymer stud grid array according to claim 8 wherein the terminals of the chip are fashioned as meltable bumps.

10. The polymer stud grid array according to claim 8 wherein the inside terminals are formed by additional polymer studs that are co-formed when injection molding the substrate and that are provided with a solderable end surface.

* * * * *